(12) United States Patent
Affinito

(10) Patent No.: US 6,497,598 B2
(45) Date of Patent: Dec. 24, 2002

(54) ENVIRONMENTAL BARRIER MATERIAL FOR ORGANIC LIGHT EMITTING DEVICE AND METHOD OF MAKING

(75) Inventor: John D. Affinito, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 38 days.

(21) Appl. No.: 09/847,233

(22) Filed: May 2, 2001

(65) Prior Publication Data

US 2001/0015620 A1 Aug. 23, 2001

Related U.S. Application Data

(62) Division of application No. 09/212,779, filed on Dec. 16, 1998, now Pat. No. 6,268,695.

(51) Int. Cl.$^7$ ................................................. H01J 9/24
(52) U.S. Cl. ................................................. 445/24
(58) Field of Search ............................ 445/24, 25, 58; 313/503, 504, 506, 509, 512; 428/690

(56) References Cited

U.S. PATENT DOCUMENTS

| 3,475,307 A | 10/1969 | Knox et al. |
| 3,607,365 A | 9/1971 | Lindlof |

(List continued on next page.)

FOREIGN PATENT DOCUMENTS

| BE | 704 297 | 2/1968 |
| DE | 19603746 | 4/1997 |

(List continued on next page.)

OTHER PUBLICATIONS

Gustafson et al., Nature, vol. 357, Jun. 11, 1992, pp. 447–479.

Affinito, J.D. et al., Polymer–Oxide Transparent Barrier Layers Produced Using the PML Process, 39th Annual Technical Conference Proceedings of the Society of Vacuum Coaters, Vacuum Web Coating Session, 1996, pp. 392–397, no month.

(List continued on next page.)

*Primary Examiner*—Kenneth J. Ramsey
*Assistant Examiner*—Joseph Williams
(74) *Attorney, Agent, or Firm*—Killworth, Gottman, Hagan & Schaeff, L.L.P.

(57) ABSTRACT

The present invention is an environmental barrier for an OLED. The environmental barrier has a foundation and a cover. Both the foundation and the cover have a top of three layers of (a) a first polymer layer, (b) a ceramic layer, and (c) a second polymer layer. The foundation and/or the cover may have a at least one set of intermediate barrier each having (a) an intermediate polymer layer with (b) an intermediate ceramic layer thereon. In a preferred embodiment, the foundation has a substrate upon which at least a top is deposited. An OLED is constructed upon the top, opposite the substrate. The cover of at least a top then placed over the OLED. The placement may be by gluing or preferably by vacuum deposition. For use as a display, it is preferred that either the ceramic layer(s) in the foundation, cover or both is substantially transparent to the light emitted by the OLED. Each layer of the foundation and the cover is preferably vacuum deposited. Vacuum deposition includes monolayer spreading under vacuum, plasma deposition, flash evaporation and combinations thereof. It is further preferred that all layers are deposited and cured between rolls or rollers to avoid the defects that may be caused by abrasion over a roll or roller.

17 Claims, 1 Drawing Sheet

U.S. PATENT DOCUMENTS

| | | | |
|---|---|---|---|
| 4,283,482 A | 8/1981 | Hattori et al. | |
| 4,581,337 A | 4/1986 | Frey et al. | |
| 4,842,893 A | 6/1989 | Yializis et al. | |
| 4,954,371 A | 9/1990 | Yializis | |
| 5,032,461 A | 7/1991 | Shaw et al. | |
| 5,237,439 A | 8/1993 | Misono et al. | |
| 5,260,095 A | 11/1993 | Affinito | |
| 5,354,497 A | 10/1994 | Fukuchi et al. | |
| 5,395,644 A | 3/1995 | Affinito | |
| 5,427,638 A | 6/1995 | Goetz et al. | |
| 5,440,446 A | 8/1995 | Shaw et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,607,789 A | 3/1997 | Treger et al. | |
| 5,620,524 A | 4/1997 | Fan et al. | |
| 5,629,389 A | 5/1997 | Roitman et al. | |
| 5,654,084 A | 8/1997 | Egert | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,711,816 A | 1/1998 | Kirlin et al. | |
| 5,725,909 A | 3/1998 | Shaw et al. | |
| 5,731,661 A | 3/1998 | So et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,792,550 A | 8/1998 | Phillips et al. | |
| 5,811,177 A | 9/1998 | Shi et al. | |
| 5,811,183 A | 9/1998 | Shaw et al. | |
| 5,821,692 A | 10/1998 | Rogers et al. | |
| 5,844,363 A | 12/1998 | Gu et al. | |
| 5,872,355 A | 2/1999 | Hueschen | |
| 5,902,641 A | 5/1999 | Affinito et al. | |
| 5,902,688 A | 5/1999 | Antoniadis et al. | |
| 5,912,069 A | 6/1999 | Yializis et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,965,907 A | 10/1999 | Huang et al. | |
| 5,996,498 A | 12/1999 | Lewis | |
| 6,040,017 A | 3/2000 | Makhael et al. | |
| 6,066,826 A | 5/2000 | Yializis | |
| 6,083,628 A | 7/2000 | Yializis | |
| 6,092,269 A | 7/2000 | Yializis et al. | |
| 6,106,627 A | 8/2000 | Yializis | |
| 6,118,218 A | 9/2000 | Yializis | |
| 6,146,225 A | 11/2000 | Sheats et al. | |
| 6,146,462 A | 11/2000 | Yializis et al. | |
| 6,198,220 B1 | 3/2001 | Jones et al. | |
| 6,214,422 B1 | 4/2001 | Yializis | |
| 6,231,939 B1 | 5/2001 | Shaw et al. | |

FOREIGN PATENT DOCUMENTS

| | | |
|---|---|---|
| EP | 0 340 935 | 11/1989 |
| EP | 0 299 753 | 2/1993 |
| EP | 0 547 550 | 6/1993 |
| EP | 0 590 467 | 4/1994 |
| EP | 0 390 540 | 8/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Affinito, J.D. et al., PML/Oxide/PML Barrier Layer Performance Differences Arising From Use of UV or Electron Beam Polymerization of the PML Layers, Thin Solid Films, 1997, vol. 308, pp. 19–25, no month.

Affinito, J.D. et al., "Vacuum Deposition of Polymer Electrolytes On Flexible Substrates", "Proceedings of the Ninth International Conference on Vacuum Web Coating", Nov. 1995 ed., R. Bakish Press 1995, pp. 20–36.

Vossen, J.L. et al., Thin Film Processes, Academic Press, 1978, Part II, Chapter II–I, Glow Discharge Sputter Deposition, pp. 12–63; Part IV, Chapter IV–1 Plasma Deposition of Inorganic Compounds and Chapter IV–2 Glow Discharge Polymerization, pp. 335–397, no month.

Penning, F.M. et al., Electrical Discharges In Gasses, Gordon and Breach Science Publishers, 1965, Chapters 5–6, pp. 19–35, and Chapter 8, pp. 41–50, no month.

Affinito, J.D. et al., "High Rate Vacuum Deposition of Polymer Electrolytes", Journal Vacuum Science Technology A 14(3), May/Jun. 1996.

Inoue et al., Proc. Jpn. Congr. Mater. Res., vol. 33, 1990. pp. 177–9, no month.

Affinito, J.D. et al., Ultra High Rate, Wide Area, Plasma Polymerized Films from High Molecular Weight/Low Vapor Pressure Liquid or Solid Monomer Precursors, Journal Vacuum Science Technology A 17(4), Jul./Aug. 1999, pp. 1974–1981.

Affinito, J.D. et al., Polymer/Polymer, Polymer/Oxide, and Polymer/Metal Vacuum Deposited Interference Filters, Tenth International Vacuum Web Coating Conference, Nov. 1996, pp. 1–14.

Affinito, J.D. et al., Vacuum deposited polymer/metal multilayer films for optical application, Thin Solid Films 270, 1995, pp. 43–48.

Affinito, J.D. et al., Molecularly Doped Polymer Composite Films for Light Emitting Polymer Applications Fabricated by the PML Process, 41st Technical Conference of the Society of Vacuum Coaters, Apr. 1998, pp. 1–6.

Affinito, J.D. et al., A new method for fabricating transparent barrier layers, Thin Solid Films 290–291, 1996, pp. 63–67.

Shaw, D.G. et al., Use of Vapor Deposited Acrylate Coatings to Improve the Barrier Properties of Metallizied Film, Society of Vacuum Coaters, 37th Annual Technical Conference Proceedings, 1994, pp. 240–244, no month.

Chahroudi, D., Transparent Glass Barrier Coatings for Flexible Film Packaging, Society of Vacuum Coaters, 34th Annual Technical Conference Proceedings, 1991, pp. 130–133, no month.

Tropsha, Y.G. et al., Activate Rate Theory Treatment of Oxygen and Water Transport through Silicon Oxide/Poly-(ethylene terephthalate) Composite Barrier Structures, J.

Phys. Chem. B, vol. 101, No. 13, 1997, pp. 2259–2266, no month.

Tropsha, Y.G. et al., Combinatorial Barrier Effect of the Multilayer SiOx Coatings on Polymer Substrates, Society of Vacuum Coaters, 40th Annual Technical Conference Proceedings, 1997, pp. 64–69, no month.

Shi, M.K., et al., Plasma treatment of PET and acrylic coating surfaces–I. In situ XPS measurements, Journal of Adhesion Science and Technology, Mar. 2000, 14(2), pp. 1–28.

Shi, M.K., et al., In situ and real–time monitoring of plasma–induced etching PET and acrylic films, Plasmas and Polymers, Dec. 1999, 4(4), pp. 1–25.

Affinito, J.D., et al., Vacuum Deposited Conductive Polymer Films, The Eleventh International Conference on Vacuum Web Coating, no earlier than Feb. 1998, pp. 200–213.

Mahon, J.K. et al., Requirements of Flexible Substrate for Organic Light Emitting Devices in Flat Panel Display Applications, Society of Vacuum Coaters, 42nd Annual Technical Conference Proceedings, 1999, pp. 456–459.

ENVIRONMENTAL BARRIER MATERIAL FOR ORGANIC LIGHT EMITTING DEVICE AND METHOD OF MAKING

CROSS REFERENCE TO RELATED APPLICATIONS

This application is a division of U.S. patent application Ser. No. 09/212,779, filed Dec. 16, 1998, now U.S. Pat. No. 6,268,695.

FIELD OF THE INVENTION

The present invention is related to environmental barrier material for organic light emitting devices (OLED), including light emitting polymer(s) (LEP). The environmental barrier prevents contact of environmental oxygen and/or water to the LED.

BACKGROUND OF THE INVENTION

Use of Light Emitting Organic Devices (sometimes known as Light Emitting Polymer, or LEP, Devices) in flat panel displays, and other information display formats, is currently limited by the poor environmental stability of the devices see C. Gustafson, Y. Cao, G. M. Treacy, F. Klavetter, N. Colaneri, and A. J. Heeger, Nature Vol. 35, Jun. 11, 1992, pages 477–479. Because of this poor environmental stability, devices are currently fabricated on glass substrates and have glass covers laminated over the top as an environmental barrier. Thus, even though the active portions of the device are of a lightweight, thin film, flexible polymer construction, the finished part is heavy and rigid because of the glass sheets needed as environmental barriers to protect the device from contact by permeation of oxygen and/or water vapor.

It has been previously reported that the single pass, roll-to-roll, vacuum deposition of a three layer combination on a PET substrate, namely PET SUBSTRATE/PML Polymer Smoothing Layer/Oxide Layer/PML Layer can be more than three orders of magnitude less permeable to oxygen and water vapor than a simple oxide layer on PET alone. J. D. Affinito, M. E. Gross, C. A. Coronado, G. L. Graff, E. N. Greenwell, and P. M. Martin, *Polymer-Oxide Transparent Barrier Layers Produced Using the PML Process*, 39$^{th}$ Annual Technical Conference Proceedings of the Society of Vacuum Coaters, Vacuum Web Coating Session, 1996, pgs. 392–397, and J. D. Affinito, Stephan Eufinger, M. E. Gross, G. L. Graff, and P. M. Martin, *PML/Oxide/PML Barrier Layer Performance Differences Arising From Use of UV or Electron Beam Polymerization of the PML Layers*, Thin Solid Films, Vol. 308, 1997, pgs. 19–25. This is in spite of the fact that the effect on the permeation rate of the PML layers alone, without the oxide layer, is barely measurable. It is believed that the reason for this tremendous improvement in barrier properties was due to two mechanisms:

1) Permeation rates in the roll-to-roll coated oxide-only layers were found to be conductance limited by holes in the oxide layer that arose when the coated substrate was wound up over system idlers/rollers and onto itself in the take up roll. The oxide coating on the tops of the sharp features and debris, on the conformally oxide coated substrate, were found to fracture. These fractures were, apparently, because these rough surface features carried all of the load (since they stick up above the plane of the substrate) when the substrate is wound up after coating. In the single pass, PML/Oxide/PML process the PML smoothing layer covered all rough, sharp, and/or uneven features in the substrate topography as well as buried any foreign debris on the substrate surface. Thus, there were no high points to fracture.

2) The PML top coat also protected the oxide layer from damage due to rough portions of the system idlers/rollers as well as from the back side of the substrate as the material was wound up.

There is, therefore, a need to encapsulate LEP devices in a flexible, transparent, environmental barrier that permits viewing while preventing ingress of oxygen and water vapor from the environment.

BACKGROUND REFERENCES

1. G. Gustafson, Y. Cao, G. M. Treacy, F. Klavetter, N. Colaneri, and A. J. Heeger, Nature, Vol 35, Jun. 11, 1992, pages 477–479.
2. J. D. Affinito, M. E. Gross, C. A. Coronado, G. L. Graff, E. N. Greenwell, and P. M. Martin, *Polymer-Oxide Transparent Barrier Layers Produced Using The PML Process*, 39th Annual Technical Conference Proceedings of the Society of Vacuum Coaters, Vacuum Web Coating Session, 1996, pgs 392–397.
3. J. D. Affinito, Stephan Eufinger, M. E. Gross, G. L. Graff, and P. M. Martin, *PML/Oxide/PML Barrier Layer Performance Differences Arising From Use of UV or Electron Beam Polymerization of the PML Layers*, Thin Solid Films, Vol 308, 1997, pg. 19–25.

SUMMARY OF THE INVENTION

The present invention is an environmental barrier for an OLED. The environmental barrier has a foundation and a cover. Either the foundation, the cover or both may have a top of three layers of (a) a first polymer layer, (b) a ceramic layer, and (c) a second polymer layer. The foundation and/or the cover may have a at least one set of intermediate barrier each having (a) an intermediate polymer layer with (b) an intermediate ceramic layer thereon. In constructing the flexible environmental barrier, the foundation is made on a substrate. An OLED is constructed upon the top, opposite the substrate. The cover of at least a top then placed over the OLED to encapsulate the OLED. The placement or encapsulation may be by gluing or laminating the cover to the foundation over the OLED or preferably by vacuum deposition of the cover layers onto the OLED. It is most preferred that the substrate, foundation and cover be flexible.

For use as a display, it is preferred that either the ceramic layer(s) in the foundation, cover or both is substantially transparent to the light emitted by the OLED.

Each layer of the foundation and the cover is preferably vacuum deposited. Vacuum deposition includes monolayer spreading under vacuum, plasma deposition, flash evaporation, sputtering, chemical vapor deposition, evaporation and combinations thereof. It is further preferred that all layers are deposited and cured between rolls or rollers to avoid the defects that may be caused by abrasion over a roll or roller.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
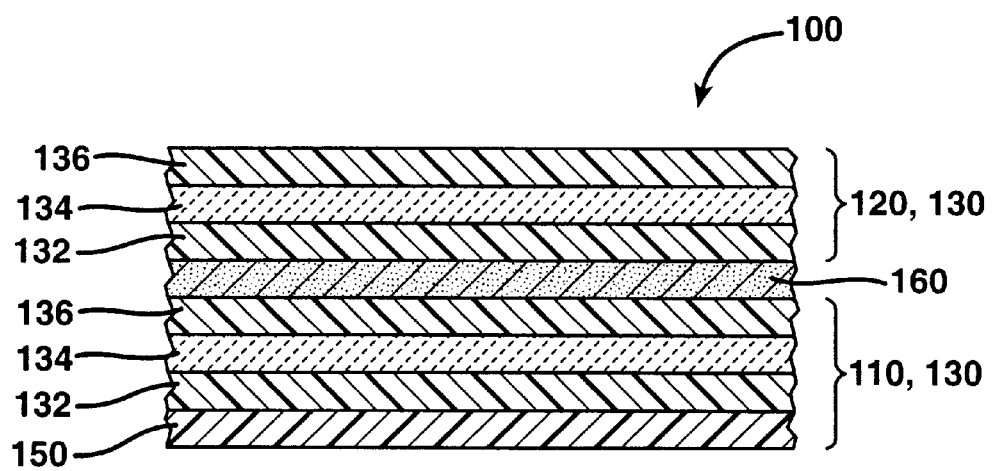
FIG. 1 is a cross section of an OLED encased with flexible environmental barrier of a foundation and a cover.
Figure 2:
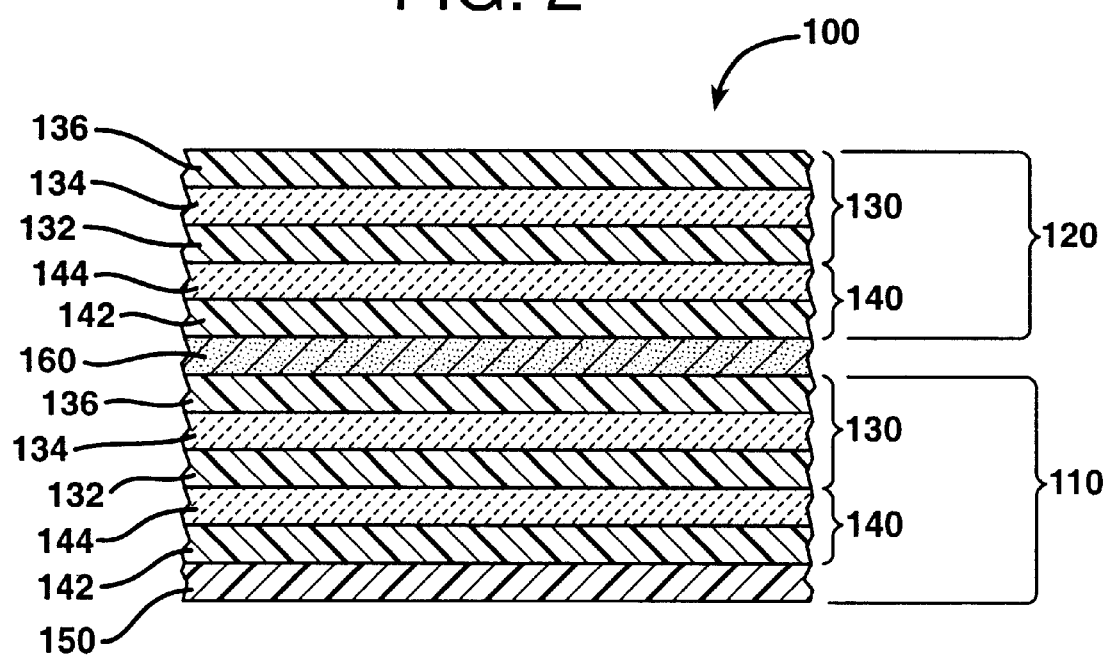
FIG. 2 is a cross section of an OLED encased with flexible environmental barrier wherein the foundation and cover include an intermediate barrier.

In order to overcome the disadvantages of the environmental barrier of glass presently used for sealing OLED, including LEP, the present invention is directed toward an environmental barrier, preferably a flexible environmental barrier as shown in FIG. 1 and FIG. 2. In FIG. 1 the flexible environmental barrier 100 is used on both sides of an OLED 160. The flexible environmental barrier may be a foundation 110, a cover 120 or a combination thereof which is preferred. Either or both of the foundation 110 and/or the cover 120 may have a top 130 of three layers of (a) a first polymer layer 132, (b) a ceramic layer 134, and (c) a second polymer layer 136. In FIG. 2 the foundation 110 and/or the cover 120 may further have a at least one intermediate barrier 140 each having (a) an intermediate polymer layer 142 with (b) an intermediate ceramic layer 144 thereon. In operation, the foundation 110 is constructed on a substrate 150 upon which at least a top 130 is deposited. The substrate 150 may remain and be part of the foundation 110 as shown or the substrate 150 may be removed from the foundation 110. An OLED 160 is constructed upon the top 130 of the foundation 110, opposite the substrate 150. The cover 120 of at least a top 130 then placed over the OLED 160. The placement may be by gluing a previously constructed cover 120 on a cover substrate (not shown), or preferably by vacuum deposition. It is preferred that the OLED 160 be encased by at least a top 130 and an intermediate barrier 140 on both sides of the OLED 160 as shown in FIG. 2.

The cover may be placed over the OLED either by lamination or gluing of the cover to the foundation or preferably by vacuum deposition of the cover layers over the OLED and to the foundation. Again, the substrate 150 may remain with the foundation 110 as shown or be separated therefrom.

In a less preferred embodiment, only the foundation 110 or the cover 120 may be used with a rigid environmental barrier, for example glass, on the opposing side.

For use as a display, it is preferred that either the ceramic layer(s) 134, 144 in the foundation 110, cover 120 or both is/are substantially transparent to the light emitted by the OLED 160.

Each layer of the foundation 110 (except the substrate 150), and the cover 120 are preferably vacuum deposited. Vacuum deposition includes vacuum deposition of the monomer with monolayer spreading under vacuum, plasma deposition, flash evaporation, as well as vacuum deposition of the ceramic layer(s) with sputtering, chemical vapor deposition, evaporation, electron cyclotron resonance source—plasma enhanced vapor deposition (ECR-PECVD) and combinations thereof. It is preferred that the assembling of the foundation and/or cover is accomplished in a manner wherein the ceramic layer is not contacted by any equipment but only by enveloping polymer layers. This may be accomplished by depositing layers in a manner wherein a set of layers (foundation or cover) of polymer/ceramic/polymer is deposited prior to contacting or touching the layers with any layer handling equipment, for example rollers in a web coating system to avoid the defects that may be caused by abrasion over a roll or roller.

The substrate may be rigid or flexible, but is preferably a flexible substrate, especially when it remains with the foundation. The flexible substrate may be any flexible material including but not limited to polymer, for example polyethyleneterephthalate (PET), metal, paper, fabric and combinations thereof.

The first, second and/or intermediate polymer layer(s) may be acrylic, methacrylic, polyester or PET, polyethylene, polypropylene, and combinations thereof.

The first and/or second ceramic layer(s) may be any ceramic including but not limited to metal oxide, metal nitride, metal carbide, metal oxynitride, indium oxide ($In_2O_3$), tin oxide ($SnO_2$), indium tin oxide (ITO) and combinations thereof. It is preferred that at least one side (foundation or cover) is preferably a substantially transparent ceramic including but not limited to silica or silicon oxide ($SiO_2$), alumina or aluminum oxide ($Al_2O_3$), titania or titanium oxide ($TiO_2$), indium oxide ($In_2O_3$), tin oxide ($SnO_2$), indium tin oxide ($ITO,In_2O_3+SnO_2$), aluminum nitride (AlN), silicon nitride (SiN), silicon carbide (SiC), silicon oxynitride (SiON) and combinations thereof.

The layers are preferably vacuum deposited. Vacuum deposition of polymers includes liquid monomer spreading in a vacuum, plasma deposition, flash evaporation and combinations thereof. Vacuum deposition of oxides includes chemical vapor deposition, plasma enhanced chemical vapor deposition, sputtering, electron beam evaporation, electron cyclotron resonance source—plasma enhanced chemical vapor deposition (ECR-PECVD) and combinations thereof.

Clearly the function of the foundation and cover is to prevent environmental constituents including but not limited to water, oxygen and combinations thereof from reaching the OLED. Accordingly the invention is a method for preventing water or oxygen from a source thereof reaching a device, the method having the steps of: depositing a first polymer layer between the device and the source; depositing an inorganic (ceramic) layer on the first polymer layer of the device by chemical vapor deposition, plasma enhanced chemical vapor deposition, sputtering, electron beam evaporation, electron cyclotron resonance source—plasma enhanced chemical vapor deposition (ECR-PECVD) and combinations thereof; and depositing a second polymer layer on said inorganic layer.

An electroluminescent device or OLED may have a flexible sheet that is transparent to light of a first wavelength;

a first polymer in contact with the flexible sheet;

a first permeation barrier (ceramic or inorganic layer) in contact with the first polymer layer;

a second polymer layer in contact with the first permeation barrier;

a first electrode having a first electrode layer in contact with the flexible sheet and transparent to light of the first wavelength;

a light emitting layer of an organic material in electrical contact with the first electrode layer;

a second electrode having a second electrode layer in electrical contact with the light emitting layer, that generates light of the first wavelength when a potential difference is applied across the first and second electrodes;

a third polymer layer in contact with the second electrode layer;

a second permeation barrier of inorganic material in contact with the third polymer layer; and a fourth polymer layer in contact with the second permeation barrier.

In this embodiment description, the combination of flexible sheet, light emitting layer, first electrode and second electrode constitute a device as recited above.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method of making a flexible environmental barrier for an organic light emitting device, comprising the steps of:
   (a) assembling a foundation by
      (i) providing a substrate;
      (ii) vacuum depositing a top by vacuum depositing a first polymer layer on the substrate, followed by vacuum depositing a first ceramic layer on the first polymer layer, then vacuum depositing a second polymer layer on the first ceramic layer;
   (b) constructing said organic light emitting device on the second polymer layer;
   (c) forming a cover by vacuum depositing a third polymer layer followed by vacuum depositing a second ceramic layer on the third polymer layer, then vacuum depositing a fourth polymer layer on the second ceramic layer; and
   (d) encapsulating said organic light emitting device by placing said cover over said organic light emitting device thereby forming said flexible environmental barrier encapsulating said organic light emitting device.

2. The method as recited in claim 1, wherein said assembling further comprises:
   placing at least one set of intermediate barrier between said substrate and said top, wherein each set is vacuum deposited by vacuum depositing (a) an intermediate polymer layer and vacuum depositing (b) an intermediate ceramic layer thereon.

3. The method as recited in claim 1, wherein said encapsulating further comprises:
   placing at least one set of intermediate barrier between said light emitting organic device and said top, by vacuum depositing (a) an intermediate polymer layer and vacuum depositing (b) an intermediate ceramic layer thereon.

4. The method as recited in claim 1, wherein said first ceramic layer is substantially transparent.

5. The method as recited in claim 1, wherein said second ceramic layer is substantially transparent.

6. The method as recited in claim 1, wherein said placing is by laminating said cover over said organic light emitting device onto said foundation.

7. The method as recited in claim 1, wherein said placing is simultaneous with said forming wherein said forming is directly upon said organic light emitting polymer.

8. The method as recited in claim 1, wherein said substrate is a flexible substrate.

9. The method as recited in claim 8, wherein said flexible substrate is removed from said foundation.

10. The method as recited in claim 1, wherein said first ceramic layer is selected from the group consisting of metal oxide, metal nitride, metal carbide, metal oxynitride and combinations thereof.

11. The method as recited in claim 10, wherein said metal oxide is selected from the group consisting of silica, alumina, titania, indium oxide, tin oxide, indium tin oxide and combinations thereof.

12. The method as recited in claim 10, wherein said metal nitride is selected from the group consisting of aluminum nitride, silicon nitride and combinations thereof.

13. The method as recited in claim 1, wherein said foundation includes a flexible substrate selected from the group consisting of polymer, metal, paper, fabric and combinations thereof.

14. The method as recited in claim 1, wherein said first polymer, second polymer, third polymer, fourth polymer, or combinations thereof is selected from the group consisting of acrylic, methacrylic, polyester or polyethyleneterephthalate (PET), polyethylene, polypropylene, and combinations thereof.

15. The method as recited in claim 1, wherein said polymer is selected from the group consisting of acrylic, methacrylic, polyester or polyethyleneterephthalate (PET), polyethylene, polypropylene, and combinations thereof.

16. The method as recited in claim 1, wherein said substrate is a rigid substrate that is removed from the foundation.

17. A method of making an environmental barrier for an organic light emitting device, comprising the steps of:
   (a) constructing a foundation by
      (i) vacuum depositing at least one intermediate barrier on a substrate each intermediate barrier having (a) a first intermediate polymer layer with (b) a first intermediate ceramic layer thereon onto the substrate;
      (ii) vacuum depositing a top of a first polymer layer on the substrate, a first ceramic layer on the first polymer layer, and a second top polymer layer on the first ceramic layer;
   (b) constructing said organic light emitting device on the second top polymer layer of the top; and
   (c) constructing a cover by
      (i) vacuum depositing at least one intermediate barrier on said organic light emitting device, each intermediate barrier having (a) a second intermediate polymer layer with (b) a second intermediate ceramic layer thereon; and
      (ii) vacuum depositing a first polymer layer on said at least one intermediate barrier with a second ceramic layer thereon and a second cover polymer layer on said second ceramic layer.

* * * * *